April 17, 1962 C. E. MAIDEN ETAL 3,030,562

MICRO-MINIATURIZED TRANSISTOR

Filed Dec. 27, 1960

CLINTON E. MAIDEN,
WAYNE F. SCHNEPPLE,
INVENTORS.

BY THEIR ATTORNEYS.

Spensley & Horn.

United States Patent Office 3,030,562

Patented Apr. 17, 1962

3,030,562

MICRO-MINIATURIZED TRANSISTOR

Clinton E. Maiden, Canoga Park, and Wayne F. Schnepple, Los Angeles, Calif., assignors to Pacific Semiconductors, Inc., Lawndale, Calif., a corporation of Delaware Filed Dec. 27, 1960, Ser. No. 78,738
7 Claims. (Cl. 317—235)

This invention relates to semiconductor devices and more particularly to improved micro-miniature transistors.

Transistors may be classified as of the point contact, grown junction, fused junction, or diffused junction type. Various combinations of these types may also be used. The present invention deals with a transistor which in its presently preferred form is a diffused junction device, but the invention is equally applicable to other types of transistors or other multi-junction devices, such as a tetrode. In this type of transistor, emitter and collector rectifying junctions or barriers are produced by establishing alternate regions of opposite conductivity contiguous to an N or P type region of semiconductor material.

The term semiconductor material, as utilized herein, is considered generic to such materials as germanium, silicon, and germanium-silicon alloys, and compounds such as indium-antimonide, gallium-antimonide, aluminum-antimonide, indium-arsenide, gallium-arsenide, gallium-phosphorous alloys and indium-phosphorous alloys and the like.

The term active impurity is used to denote those impurities which affect the electrical characteristics or semiconductor materials as distinguished from other impurities which have no appreciable effect upon these characteristics. Active impurities are ordinarily classified as donor impurities such as bismuth, phosphorous, arsenic and antimony, or acceptor impurities such as boron, aluminum, gallium and indium.

A region of semiconductor material containing an excess of donor impurities and yielding an excess of free electrons is considered to be an impurity doped N type region. An impurity doped P type region is one containing an excess of acceptor impurities resulting in a deficit of electrons, or an excess of holes. Stated differently, an N type region is one characterized by electron conductivity, whereas a P type region is one characterized by hole conductivity.

A heavily doped region of N type conductivity may alternatively be referred to as an $N^+$ region, the plus indicating that the concentration of the active impurity in the region is greater than the minimum required to determine the conductivity type. Similarly, a $P^+$ region would indicate a more heavily than normal doped region of P type conductivity.

A region of semiconductor material in which the donors and acceptors are substantially in balance so that the excess carrier concentration is very small and the resistivity is relatively high, is considered to be a substantially intrinsic region. The substantially intrinsic region may be alternatively herein referred to as an I region.

When a continuous solid crystal specimen of semiconductor material has an N type region adjacent to a P type region, the boundary between the two regions is termed a P-N or N-P junction, or simply a junction. A transistor has at least two such junctions; if a P type conductivity region separates two N type conductivity regions, it is termed an N-P-N transistor. Conversely, if an N type conductivity region separates two P type conductivity regions, it is termed a P-N-P transistor. The present invention is clearly applicable to both, but for the sake of clarity and simplicity it will be discussed with reference to an N-P-N device.

As the art of miniaturization has developed in the electronics industry it has been found necessary to reduce still further in size glass-to-metal packages housing the semi-conductor devices. Inasmuch as the active crystal element of a semiconductor transistor, for example, amounts to but a very small fraction of the total volume of the completed package, it is clear that as the volume of the package approaches that of the crystal, optimum miniaturization will more nearly be achieved. In addition to decreasing the size, recently developed uses for semiconductor devices have made necessary greatly increased reliability in the freedom of the devices from mechanical or electrical failure when subjected to abuse and environmental conditions.

The prior art devices are typically housed in packages which involve a glass-to-metal seal requiring close manufacturing tolerances. Due to such limitations the present art semiconductor crystal devices are expensive to manufacture and are often not as reliable as desired. By the most common prior art techniques, encapsulation methods and techniques whereby the active elements of the device are packaged in glass, glass-metal, ceramic, or plastic cases, the reliability of the device and its possibility of failure due to environment and conditions of use are dependent upon reliability of the protective housing. That is, the encapsulation or housing must form a hermetic seal about the crystal element of the semiconductor device mounted therein to protect the device from the adverse effects of ambient moisture. This particular requirement is especially critical when the crystal element of the semiconductor device is composed of an intrinsic semiconductor such as germanium or silicon which is particularly sensitive to even slight increases or changes in humidity.

In accordance with the most common type of prior art construction, a small semiconductor crystal is mounted on a glass-to-metal sealed "header," the header having three metal leads extending outward from the main structure. Small wires are then attached to the crystal and the header leads. The entire assembly is subjected to etching and cleaning processes, and a metal lid or can is welded to the header sealing the semiconductor crystal and the small contact wires therein. Great care is necessary in the manufacturing method to see that the unit is sealed in a clean, dry gaseous atmosphere. Such prior art methods of manufacture involve expensive packaging parts and for purposes of micro-miniaturization, the assembly is of relatively large size and weight. In addition the structure is relatively complicated and there is relatively poor P-N junction protection.

Accordingly, it is a primary object of the present invention to provide an improved semiconductor transistor which is at least an order of magnitude smaller than existing prior art devices.

Another object of the present invention is to provide a micro-miniaturized transistor of high reliability.

It is another object of the present invention to provide such a micro-miniaturized semiconductor transistor having electrical characteristics equivalent to transistors of much greater size.

It is another object of the present invention to provide a semiconductor transistor the total encapsulated size of which approaches that of the active crystal element.

Yet another object of the present invention is to provide a micro-miniaturized semiconductor transistor having a maximum power dissipation relative to its size.

It is a still further object of the present invention to provide a very small semiconductor transistor which lends itself to ease and economy of manufacture.

In accordance with the present invention a semiconductor crystal having the required junctions formed therein for transistor action is mounted on a ribbon shaped electrical lead. Small contact wires are then attached to the regions of the crystal and extended therefrom such that if the ribbon shaped lead is the collector lead the small contact wires are attached to the emitter and base regions of the crystal body and are extended therefrom in opposite directions. The assembly is then etched and the semiconductor surface is treated in order to passivate the surface. This treatment makes the element stable as long as the thin surface passivating film is not disturbed. To insure mechanical protection and moisture protection of the film and the underlying crystal device, a coating of encapsulating material is applied to the device to surround the crystal and the lead and contact wires adjacent to the crystal; the encapsulating material is then cured.

The transistor of the present invention as compared to standard prior art transistors, such as the TO–18, generally the smallest of prior art transistors, is approximately 1/1000 of the overall size of the TO–18.

While the novel and distinctive features of the invention are particularly pointed out in the appended claims the more expository treatment of the invention in principle and detail together with additional objects and advantages thereof is afforded by the following description in the accompanying drawing in which like reference characters are used to refer to like parts throughout the several views.

For purposes of illustration and clarity of description, the invention will be discussed in connection with N-P–N diffused junction type transistor using silicon semiconductor material, it being expressly understood, however, that the invention is equally applicable to other types of transistors and to the utilization of other semiconductor material, as well as to P-N-P or P-N-I-P transistors, or the like.

Figures 1, 3, 4:
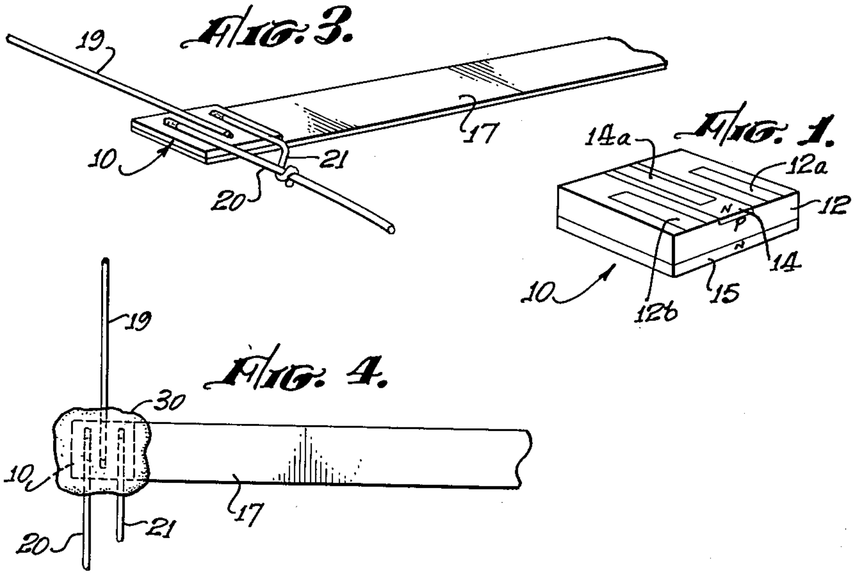
FIGURE 1 is a view of a semiconductor crystal body in which the various conductivity regions defining a transistor body have been formed.
FIGURE 3 is a view in perspective of an alternative embodiment of the present invention prior to encapsulation.
FIGURE 4 is a view in perspective similar to FIGURE 2 after encapsulation of the device.
Figure 5:
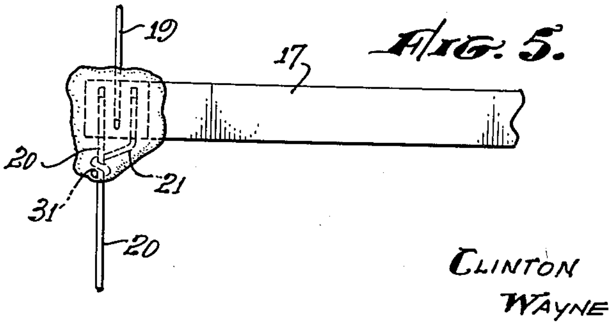
FIGURE 5 is a view in perspective of the device of FIGURE 3 after encapsulation thereof.

Referring now to the drawing and particularly FIGURE 1, there is shown a semiconductor crystal body 10 which in this embodiment is formed of silicon. The crystal body includes a P type conductivity region 12 and an N type conductivity region 14 formed in the upper surface of the body 10 in the orientation of the figure. A second N type region 15 is formed at the lower surface of the crystal body. The N type regions are separated from the P type conductivity region by P-N junctions. The N type regions and P-N junctions may be produced by any method known to the art such as by alloying or diffusion techniques for example. The invention is equally applicable, as discussed above, to P-N-P, P-N-I-P, and other device configurations. The N type region 15 extends across the entire surface of the crystal body and serves as the collector region of the transistor. The N type region 14 which is the emitter region extends as a strip between opposed edges of the upper surface. Spaced apart parallel metallized strips are ohmically bonded to the upper surface of the crystal body for making electrical connections thereto. Two strips **12*a* and 12*b* are affixed to the P type region at opposite sides of the N region 14 while the center strip 14*a* is affixed to the N region 14**.

The crystal body is mounted upon and ohmically connected to the collector lead 17. The lead 17 is ribbon shaped throughout its length. That is, the cross-sectional configuration of the lead 17 is rectangular. In the presently preferred embodiment the ribbon shaped lead 17 is formed from a metal having proper physical and electrical properties, such as nickel, molybdenum, or Kovar. In this embodiment Kovar is used. The Kovar lead is plated with a coating of gold about the entire outer surface thereof since the gold plating makes possible an easier and better mechanical connection between the lead and the crystal body. To illustrate the size of the device the lead is 0.0035 by 0.019 by 0.625 inch.

The lower surface of the crystal body which is of N type conductivity is ohmically affixed to the lead 17 proximate the end thereof upon the substantially planar surface. The crystal body is approximately equal in diameter or width to the width of the collector lead 17 and is ohmically connected to the lead such that the lead becomes the collector lead of the finished transistor device. The ohmic bonding of the lead 17 to the crystal body can be accomplished by methods well known to the art. One such method when the lead is coated with gold is to form the bond between the crystal and the lead by placing the crystal and the lead under pressure in a furnace and heating to a temperature sufficient to cause alloying between the silicon and the gold to produce a silicon-gold eutectic or alloy region. Temperatures of approximately 450° C. may be suitably employed at pressures of from 800 to 1000 p.s.i. between the lead 17 and crystal 10 to cause bonding of the lead 17 to the N type crystal surface. The crystal is oriented upon the lead 17 such that the metallized strips **12*a*, 12*b* and 14*a* which are parallel and spaced apart upon the upper surface of the crystal body extend substantially transverse to the length of the collector lead 17**.

Electrical connector wires are then affixed to the N and P type regions of the crystal body. That is, wires of small diameter and of good electrical conductivity are each connected at one end to a respective one of the P or N type regions. In the illustrative embodiment a single connecting wire 19 is connected between the center N type region, or the emitter region and is extended to one side of the crystal body transversely to the longitudinal axis of the collector lead. Similarly, two connector wires 20 and 21 are ohmically affixed to the two metallized strips **12*a* and 12*b* on the base region 12 at opposite sides of the emitter region. The two base connectors 20 and 21 are extended to the opposite side of the crystal body from that of the emitter connector 19**. These connectors thus become the base leads of the device.

As shown in FIGURE 3, the base leads 20 and 21 can be joined by any suitable means such as by welding or twisting into electrical contact at a position at which they will not contact the crystal body. In the presently preferred embodiments of both FIGURES 2 and 3, gold clad nickel wires approximately 0.003 inch in diameter are utilized for the three wire connectors.

After the connectors 19, 20 and 21 have been ohmically connected to the crystal body, a thin protective film is formed upon the device to cover and protect the device from the ambient. That is, a relatively thin esterified film, i.e., less than one micron in thickness is formed on the semiconductor crystal 10 in accordance with the method hereinafter described. The film surrounds the active crystal element to protect the element and the associated ohmic contacts from the ambient atmosphere. This treatment makes the elements stable so long as the very thin film is not disturbed. It is also believed that this treatment serves to oxidize and thus render immobile and stable contaminants which may exist on the surface of the crystal, especially in the vicinity of the junction.

The surface treatment herein referred to is carried out as follows. The mounted device, to which leads have been attached, is immersed for approximately fifteen seconds in a 30% solution of hydrogen-peroxide which is maintained at around 80° C. It is believed that the hydrogen-peroxide immersion serves several purposes.

Ordinarily, during the fabrication of the present invention transistor, there is provided an oxide coating which serves as a mask against diffusion and metallizing. The hydrogen-peroxide serves to oxidize the surface to thus produce a more homogeneous thin oxide film, i.e., one compatible with the pre-existent oxide film. Further, it is believed that oxidation of contaminants which may be present on the surface of the device will occur, thus rendering the same immobile and serving to reduce any harmful electrical effects which may otherwise result. Finally, it is believed that this oxide which is esterified by exposure to alcohol as will now be described, serves to produce a better bond with the final coating material.

Following immersion in the hydrogen-peroxide, the transistors are quickly removed and placed in boiling alcohol, preferably ethanol, for approximately one-half hour. If the devices are not then to be further treated, they are stored in ethanol which is kept at room temperature. Otherwise, they are removed from the ethanol and then coated with the final coating material as herein described.

The immersion in the ethanol which acts as a quench solution was intended to be exemplary only. Any organic liquid which has a reactive hydroxyl group broadly designated herein as $R(OH)_x$; specifically a monohydric or polyhydric aliphatic alcohol containing from one to four carbon atoms per molecule may be used. A 95% ethenol alcohol solution is particularly preferred as was hereinbefore mentioned. It is necessary to transfer the device including the silicon body quickly from the hydrogen-peroxide solution to the alcohol quench solution to prevent undue exposure to the ambient. Briefly, hydrated silica is formed at the silicon surface when the body is immersed in the quench solution and will react with the hydroxyl radical at the silicon surface to form ester groups which are molecularly bonded with the silicon as a film upon the silicon surface. The film is less than one micron and normally on the order of 100 to 1000 angstrom units in thickness.

After formation of the device, as shown in FIGURE 1, with a thin protective film formed thereon, which protects the active crystal element and bonded areas from the ambient, an encapsulating material is formed upon the device to afford physical strength and long term protection from the ambient. Such materials include epoxy resins, polysiloxanes, glass, ceramics, or similar material which will provide added strength for the device.

One such material which has been found particularly advantageous for encapsulation is a polymer formed of polyester resin containing a free hydroxyl group to which has been added polyisocyanate copolymer. In the presently preferred embodiment toluene diisocyanate is utilized as the polyisocyanate compound and the polyester resin is a silicone-modified terephalate polyester varnish. One such varnish which has been found suitable for the purposes of the present invention is a heat stable modified silicone electrical insulating, dipping, and impregnating varnish such as that manufactured under the trademark "Sylkyd 1400 Varnish" by the Dow-Corning Corporation. In the present embodiment the specific encapsulating material used comprises 10 parts by weight of toluene diisocyanate to 100 parts by weight of the solids forming the silicone modified terephalate polyester resin. To encapsulate the device, the device having a thin protective film formed thereon is transferred to a dry box and heated by infra-red lamps at approximately 100° C. to evaporate any alcohol remaining from the quench. The device is then coated with the encapsulating material of the present invention by painting with a glass tipped rod. The encapsulating material is cured by drying the coated device at approximately 60° C. for approximately 15 minutes in vacuum. The final cure is then made by heating the device at approximately 200° C. for 200 hours.

Figure 2:
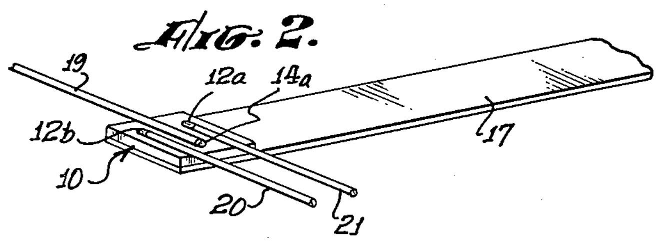
FIGURE 2 is a view in perspective of a presently preferred embodiment of the present invention prior to encapsulation thereof.

Thus the finished illustrated device comprises an encapsulated transistor which is not substantially greater in size than the bare device including the crystal element and the base collector and emitter leads. The finished device of FIGURE 2 is shown in FIGURE 4 with the mass 30 of encapsulating material surrounding the crystal body and adjacent portion of the connectors. In the embodiment of FIGURE 3, the encapsulating mass 30 surrounds the connection 31 of the base leads such that a single base lead extends from the device. Illustrative of the size of the device is the presently preferred embodiment in which the crystal is 0.028 inch in width and length and 0.006 inch in thickness. The lead 17 is 0.0035 by 0.019 by 0.625 in length. The encapsulating package is .035 inch in width and length by .050 inch in thickness.

In addition to the encapsulation means described above, others can be used such as glass encapsulation and by potting the device with various potting compounds such as epoxy, ceramics, plastics, and the like.

What is claimed is:

1. A miniaturized semiconductor device comprising: a semiconductor crystal element having first and second opposed contact surfaces, said first surface defining a first conductivity region, said second surface defining second and third conductivity regions; an electrical lead having a longitudinally extending end portion defining a substantially planar surface, said first surface of said crystal element being ohmically bonded to said planar surface of said lead proximate the end thereof; a first electrical connector connected to said second conductivity region; a second electrical connector connected to said third conductivity region; and an esterified passivating film formed on said crystal element on the surfaces thereof not in contact with said lead or said connectors.

2. A miniaturized semiconductor device comprising: a semiconductor crystal element having first and second opposed contact surfaces, said first surface defining a first conductivity region, said second surface defining second and third conductivity regions; an electrical lead having a longitudinally extending end portion defining a substantially planar surface, said first surface of said crystal element being ohmically bonded to said planar surface of said lead proximate the end thereof; a first electrical connector connected to said second conductivity region; a second electrical connector connected to said third conductivity region; an esterified passivating film formed on said crystal element on the surfaces thereof not in contact with said lead or said connectors; and an encapsulating moisture impervious electrically insulating material surrounding said crystal and adjacent portions of said connectors and lead in direct contact with said crystal, connectors and lead.

3. A miniaturized semiconductor transistor comprising: a semiconductor crystal element of one conductivity type having a substantially planar first contact surface and an opposed second contact surface; spaced apart substantially parallel regions of second conductivity type formed in said second contact surface; a ribbon shaped electrical lead of substantially rectangular cross-section, said first surface of said crystal element being ohmically bonded to said lead proximate an end thereof; a first electrical connector connected to one of said regions of second conductivity type; a second electrical connector connected to another of said regions of second conductivity type; and an esterified passivating film formed on said crystal element on the surfaces thereof not in contact with said lead or said connectors.

4. A miniaturized semiconductor transistor comprising: a semiconductor crystal element of one conductivity type having a substantially planar first contact surface and an opposed second contact surface; spaced apart substantially parallel regions of second conductivity type formed in said second contact surface; a ribbon shaped electrical lead of substantially rectangular cross-section, said first surface of said crystal element ohmically bonded to said lead proximate an end thereof; a first electrical connector connected to one of said regions of second conductivity type; a second electrical connector connected to another of said regions of second conductivity type; an esterified passivating film formed on said crystal element on the surfaces thereof not in contact with said lead or said connectors; and an encapsulating moisture impervious electrically insulating material surrounding said crystal and adjacent portions of said connectors and lead in direct contact with said crystal, connectors and lead.

5. A miniaturized semiconductor transistor comprising: a semiconductor crystal element of one conductivity type having a substantially planar first contact surface and an opposed second contact surface; first, second, and third spaced apart substantially parallel regions of second conductivity type formed in said second contact surface; a ribbon shaped electrical lead of substantially rectangular cross-section; said first surface of said crystal element being ohmically bonded to said lead proximate an end thereof, said lead being substantially equal in width to the width of said crystal element; a first electrical wire connector connected to said second region of second conductivity type intermediate said first and third regions; second and third electrical wire connectors connected to said first and third regions of second conductivity type; and an esterified passivating film formed on said crystal element on the surfaces thereof not in contact with said lead or connectors.

6. A miniaturized semiconductor transistor comprising: a semiconductor crystal element of one conductivity type having a substantially planar first contact surface and an opposed second contact surface; first, second, and third spaced apart substantially parallel regions of second conductivity type formed in said second contact surface; a ribbon shaped electrical lead of substantially rectangular cross-section, said first surface of said crystal element being ohmically bonded to said lead proximate an end thereof, said lead being substantially equal in width to the width of said crystal element; a first electrical wire connector connected to said second region of second conductivity type intermediate said first and third regions; second and third electrical wire connectors connected to said first and third regions of second conductivity type; an esterified passivating film formed on said crystal element on the surfaces thereof not in contact with said lead or connectors; and a body of encapsulating moisture impervious electrically insulating material surrounding said crystal and adjacent portions of said connectors and lead in direct contact therewith.

7. A miniaturized semiconductor transistor comprising: a semiconductor crystal element of one conductivity type having a substantially planar first contact surface and an opposed second contact surface; first, second, and third spaced apart substantially parallel regions of second conductivity type formed in said second contact surface; a ribbon shaped electrical lead of substantially rectangular cross-section, said first surface of said crystal element being ohmically bonded to said lead proximate an end thereof, said lead being substantially equal in width to the width of said crystal element; a first electrical wire connector connected to said second region of second conductivity type intermediate said first and third regions; second and third electrical wire connectors connected to said first and third regions of second conductivity type; an esterified passivating film formed on said crystal element on the surfaces thereof not in contact with said lead or connectors; and a body of polymerized material surrounding said crystal and adjacent portions of said connectors and lead in direct contact therewith, said polymer being formed of polyester resin containing a free hydroxyl group to which has been added polyisocyanate copolymer.

References Cited in the file of this patent

UNITED STATES PATENTS

| | | |
|---|---|---|
| 2,624,016 | White | Dec. 30, 1952 |
| 2,771,382 | Fuller | Nov. 20, 1956 |
| 2,825,822 | Chaang | Mar. 4, 1958 |
| 2,887,415 | Stevenson | May 19, 1959 |
| 2,953,730 | Pantchechnikoff | Sept. 20, 1960 |